United States Patent
Buter et al.

(10) Patent No.: US 8,049,561 B2
(45) Date of Patent: Nov. 1, 2011

(54) CLASS D AMPLIFIER

(75) Inventors: Berry A. J. Buter, Veldhoven (NL); Andrianus J. M. Van Tuijl, Eindhoven (NL)

(73) Assignee: NXP B.V., Eindhoven (NL)

( * ) Notice: Subject to any disclaimer, the term of this patent is extended or adjusted under 35 U.S.C. 154(b) by 116 days.

(21) Appl. No.: 12/447,093

(22) PCT Filed: Oct. 19, 2007

(86) PCT No.: PCT/IB2007/054262
§ 371 (c)(1), (2), (4) Date: Apr. 24, 2009

(87) PCT Pub. No.: WO2008/050273
PCT Pub. Date: May 2, 2008

(65) Prior Publication Data
US 2010/0090764 A1    Apr. 15, 2010

(30) Foreign Application Priority Data
Oct. 26, 2006 (EP) .................................... 06123012

(51) Int. Cl.
*H03F 3/217* (2006.01)
(52) U.S. Cl. ........................ 330/251; 330/297
(58) Field of Classification Search .......... 330/251, 330/253, 255, 297
See application file for complete search history.

(56) References Cited

U.S. PATENT DOCUMENTS

| | | | |
|---|---|---|---|
| 4,894,621 A | | 1/1990 | Koenig et al. |
| 5,506,493 A | * | 4/1996 | Stengel .................. 323/223 |
| 5,610,553 A | | 3/1997 | Kirn |
| 5,960,898 A | | 10/1999 | Okada et al. |
| 6,148,073 A | | 11/2000 | Helfand |
| 2005/0110559 A1 | | 5/2005 | Farkas et al. |
| 2006/0061419 A1 | | 3/2006 | Edwards |
| 2006/0103458 A1 | | 5/2006 | Hansen et al. |

OTHER PUBLICATIONS

Bekhout, Marco; "Integrated Audio Amplifiers in BCD Technology"; Kluwer Academic Publishers, 1997.
Rajapandian, Saravanan, et al; "Charge-Recycling Voltage Domains for Energy-Efficient Low-Voltage Operation of Digital CMOS Circuits"; Proceedings of the 21st International Coference on Computer Design; IEEE; 2003.

* cited by examiner

*Primary Examiner* — Robert Pascal
*Assistant Examiner* — Khiem Nguyen

(57) ABSTRACT

The invention refers to an amplifier (1) comprising a switchable capacitive divider (10) for dividing a supply voltage delivered to the amplifier (1), the switchable capacitive divider being coupled to a coupling circuit (15) via a first wire and a second wire, the coupling circuit determining a connection path between said first and second wire and a first capacitor (C2) and a switchable power circuit (20).

8 Claims, 6 Drawing Sheets

CLASS D AMPLIFIER

RELATED PATENT DOCUMENTS

This patent document is a 35 U.S.C. §371 national stage entry of International Application No. PCT/IB2007/054262 filed on Oct. 19, 2007, which claims priority benefit under 35 U.S.C. §119 of Great Britain Patent Application No. 06123012.4 filed on Oct. 26, 2006, to which priority is also claimed here.

FIELD OF THE INVENTION

The invention refers to a power amplifier.

BACKGROUND OF THE INVENTION

Class D amplifiers comprise a switching power stage for driving a load. The output signal is a pulse-width modulated (PWM) signal. The output signal is further low-pass filtered at the amplified output and the remaining signal is the analog output signal. A multi-level PWM signal, which represent more accurately the input signal may be used, for reducing the high frequency content, and simplify filtering. For such an amplifier, an output stage that can reproduce multiple output levels may be used. FIG. 1, shows a common way to implement a multi-level switching power-stage, that operates from a single supply voltage. It is implemented by putting multiple half-bridge switching stages in parallel i.e. combinations M1, M3 and Mx, My in FIG. 1. When the parallel stages are driven by appropriate signals and the outputs are summed up, a multi-level PWM output is generated. A three-level switching power stage using this principle is shown in FIG. 1. Z1 and Z2 are inductors, for making an accurate superposition of the output signals from the parallel half-bridge stages.

The three-level switching stage shown in FIG. 1 may generate an output signal with a level equal to ground, half supply voltage Vs or supply voltage Vs. A known circuit for deriving a voltage that equals half of the supply voltage is a capacitive divider as shown in FIG. 2 and also in Bekhout, Marco "Integrated Audio Amplifiers in BCD Technology", Kluwer Academic Publishers, 1997. If an output voltage V0 is larger then half the supply. Capacitor C2 will be discharged by the load current I1 and the voltage across the capacitor will decrease and hence the output voltage Vo. Capacitor C1 is charged by the load current I1 and the voltage across this capacitor will increase. When the output voltage drops a certain value below half the supply voltage the capacitors are interchanged. The capacitor C1 connected between nodes a and b before interchanging will be connected between nodes c and d afterwards with the positive plate of the capacitor connected to node c. Capacitor C2 connected between nodes c and d will after interchanging be connected between nodes a and b with the positive plate of the capacitor connected to node a. After the interchanging the output voltage is again above half the supply voltage. By repeating the interchanging of the capacitors continuously a voltage equal to half the supply voltage with some ripple is generated.

The circuit also works if only one capacitor is and it is switched as was the case for the situation with two capacitors. During switching the output voltage is not defined. A buffer capacitor can be added to supply the current to the load during switching. Because of the series-parallel connection of C1 and Cb there will be some charge redistribution and the steady-state output will be somewhat lower then half the supply voltage as is shown in FIG. 3. The implementation of this capacitive divider stage is less complex than that shown in FIG. 2 and requires fewer transistors.

SUMMARY OF THE INVENTION

It is therefore a need to simplify the implementation of a class D power amplifier in order to save occupied area when it is implemented in an integrated circuit. The invention is defined by the independent claims. Dependent claims define advantageous implementations.

The invention may be realized in an amplifier comprising: a switchable capacitive divider for dividing a supply voltage delivered to the amplifier, the switchable capacitive divider being coupled to a coupling circuit via a first wire, the coupling circuit for determining a connection path between said first wire and a first capacitor and a switchable power circuit.

The combination of a capacitive divider and the switchable power circuit can be implemented to eliminate the need of the inductors and therefore the circuit can be easier integrated on a common chip. The capacitive divider is further simplified because the first capacitor can be used both as a coupling element and as part of the voltage division process.

In an embodiment, wherein the divider comprises a first switch coupled to a second switch via a second capacitor. The first switch is further coupled to a first terminal of a third switch, the second switch being further coupled to first terminal of a fourth switch. The implementation has the advantage that allows different alternatives for implementing the power amplifier.

In another embodiment, a second terminal of the third switch is coupled to a second terminal of the fourth switch and to an output node. The first capacitor is coupled to the output node, said node being further coupled to the switchable power circuit via a fifth switch having a first terminal coupled to the output node and a second terminal coupled to a power terminal. Alternatively, the output node may be coupled to a power terminal and a fifth switch is coupled between the first capacitor and the output node.

In another embodiment the switchable power circuit comprises a sixth switch and a seventh switch, a terminal of the sixth switch being coupled to another terminal of the seventh switch and further coupled to the power terminal.

An application, which is used for generating more power is a bridge amplifier comprising two amplifiers as claimed in any preceding claims, said amplifiers having their respective power terminal coupled to an output load. In this case an alternative implementation of the amplifier is possible using the same capacitive divider. In this case the bridge amplifier comprising an amplifier coupled to a first terminal of a load, the bridge amplifier further comprising another switchable power circuit having another output power terminal coupled to another terminal of the load, the bridge amplifier further comprising an additional switch for coupling an output of the capacitive divider to the another power terminal. In this case a further reduction in occupied area is realized.

In another embodiment the power amplifier is integrated into a chip, the chip further comprising a voltage multiplier coupled to a supply voltage source for supplying the amplifier with a variable voltage. In this way a power boost is realized and the output power of the amplifier is further increased. These circuit elements are illustrated in FIG. 11 as voltage multiplier 100 and amplifier 1.

BRIEF DESCRIPTION OF THE DRAWINGS

The above and other advantages will be apparent from the exemplary description of the accompanying drawings in which.

DETAILED DESCRIPTION OF EMBODIMENTS

Figure 1:
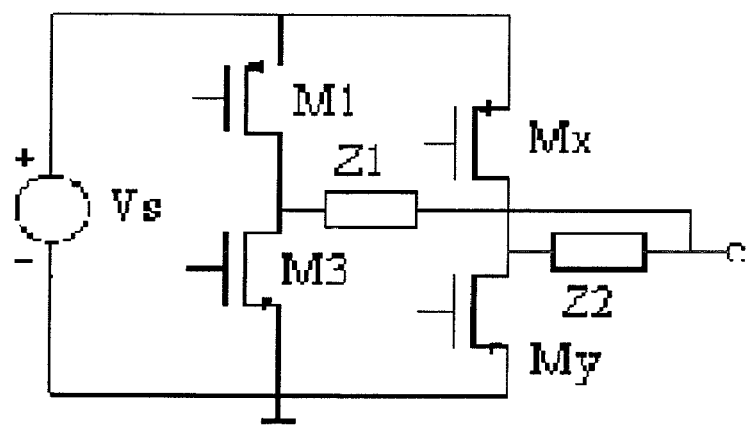
FIG. 1 depicts a prior art class D amplifier.
Figure 2:
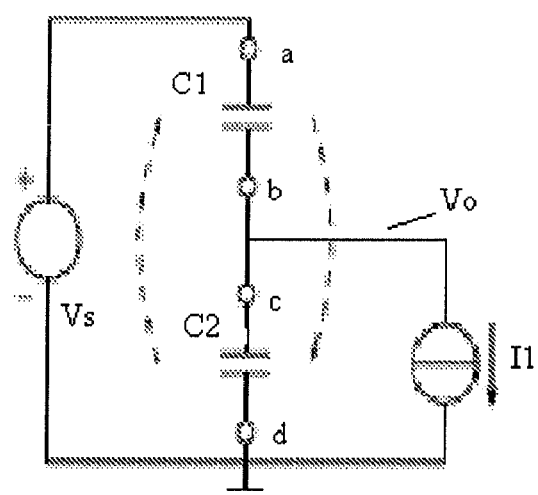
FIG. 2 depicts a known capacitive divider.
Figure 3:
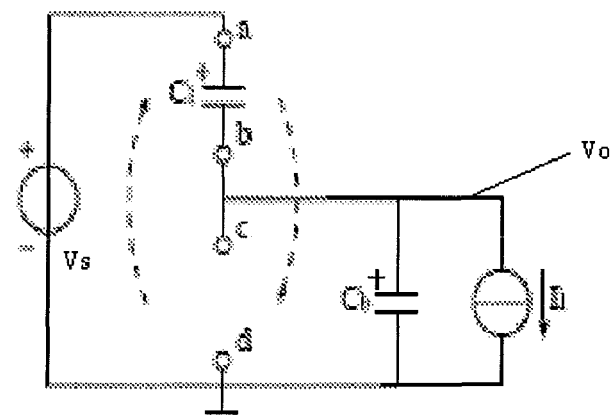
FIG. 3 depicts an alternative capacitive divider.
Figure 4:
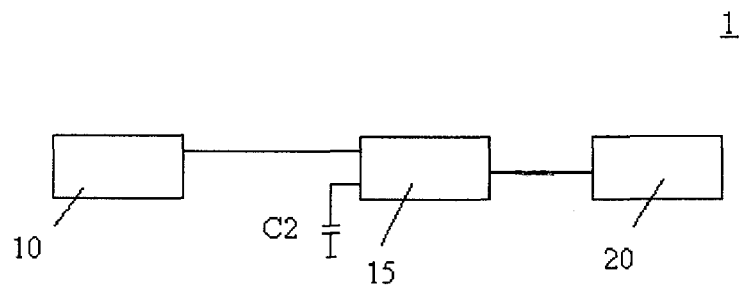
FIG. 4 depicts a class D amplifier according to the invention.
Figure 5:
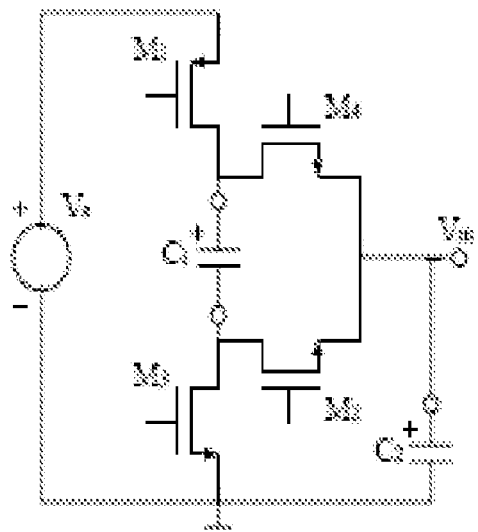
FIG. 5 depicts an implementation of the capacitive divider according to the invention.

FIG. 4 depicts a class D amplifier 1 according to the invention having a switchable capacitive divider 10 for dividing a supply voltage delivered to the amplifier. The switchable capacitive divider is coupled to a coupling circuit 15 via a first wire. The coupling circuit determines a connection path between said first wire and a first capacitor C2 and a switchable power circuit 20. In this way it is eliminated the need of inductors and the amplifier can be integrated on a smaller area. Furthermore, the capacitive divider can be simplified as shown in FIG. 5, which depicts an implementation of the capacitive divider according to the invention. The capacitive divider comprises a first switch MI coupled to a second switch M3 via a second capacitor C1. The first switch Ml is further coupled to a first terminal of a third switch M4, the second switch M3 being further coupled to first terminal of a fourth switch M2. A second terminal of the third switch M4 being coupled to a second terminal of the fourth switch M2 and to an output node Vm. The switches are shown as MOS transistors but other implementations as mini-switches, MEMS or other types of transistors as bipolar ones are not excluded. In this implementation at node Vm, half of the supply voltage is obtained.

Figure 6:
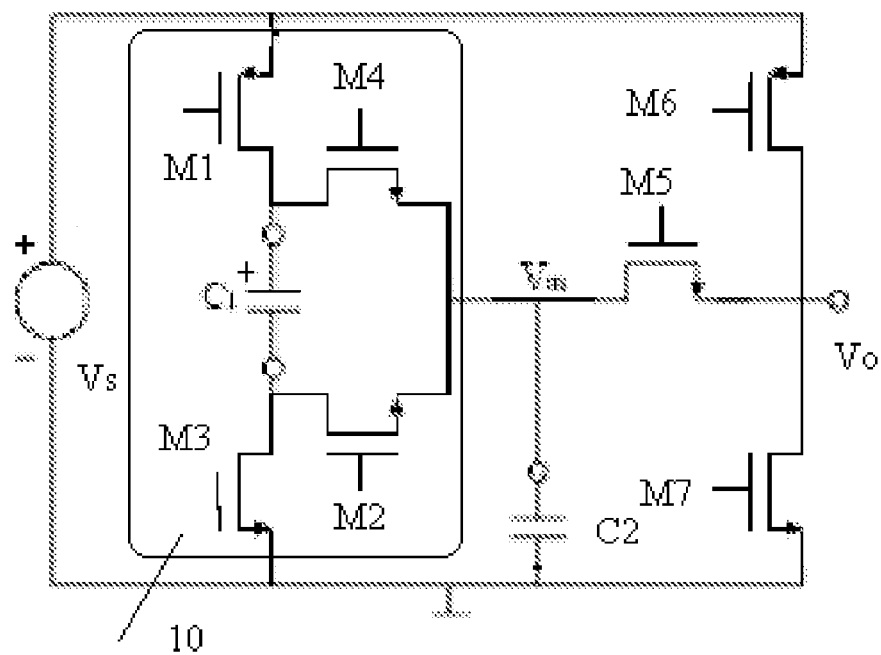
FIG. 6 depicts an implementation of a power amplifier according to the invention.

An implementation of the power amplifier is shown in FIG. 6. The output Vo can now be switched to ground level by turning transistor M7 ON, to a level equal to half supply voltage by turning transistor M5 ON or to a level equal to the supply voltage by turning transistor M6 ON. For generating the level equal to half the supply voltage three transistors are connected in series. The series connection of transistors increases the ohmic resistance and conductive losses. At the expense of an 3 times increase in transistor area the ohmic resistance of the series connected transistors can be made equal to a single transistor. The area increase lowers the conductive losses but increases the switching losses. An improved implementation of the switching stage with only two transistors in series when a level equal to half the supply voltage is generated is depicted in FIG. 7.

Figure 7:
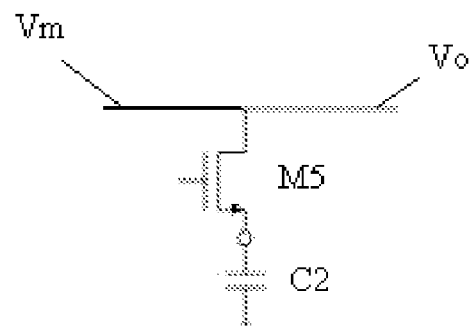
FIG. 7 depicts an alternative implementation of the coupling circuit according to the invention.

In FIG. 7, the capacitive divider is now only operated when an output level equal to half the supply voltage needs to be generated. When either of the transistors in the half-bridge stage M6, M7 are operated both transistors M4 and M2 are turned off. Transistors M1 and M3 are also not operated anymore and capacitor C1 is effectively kept floating. The buffer capacitor C2 is only connected to the output when an output level equal to half the supply voltage is generated. In this way capacitor C2 is not discharged or charged when the half-bridge stage is operated. A further improvement of this circuit, which eliminates the requirement for an additional half-bridge stage is depicted in FIG. 8.

Figure 8:
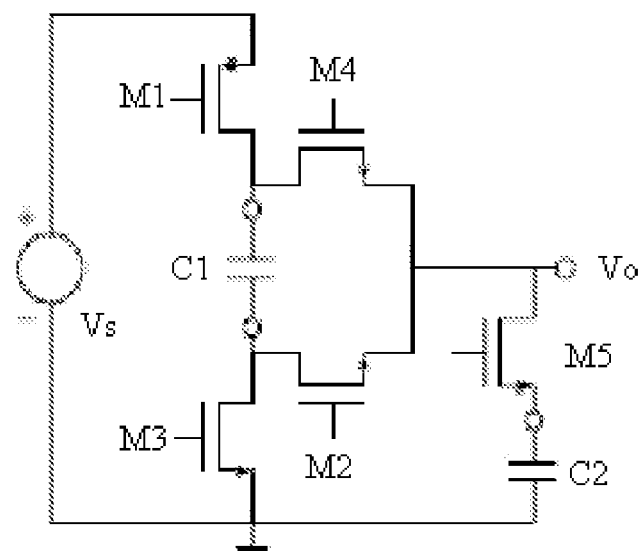
FIG. 8 depicts an alternative implementation of the amplifier according to the invention.

In FIG. 8, when an output level equal to half the supply voltage is generated the circuit operates in the same way as explained earlier. To generate now an output level equal to ground transistors M2 and M3 are turned on and all the other transistors are then turned off. To generate now an output level equal to the supply voltage transistors M1 and M4 are turned on and all the other transistors turned off.

Figure 9:
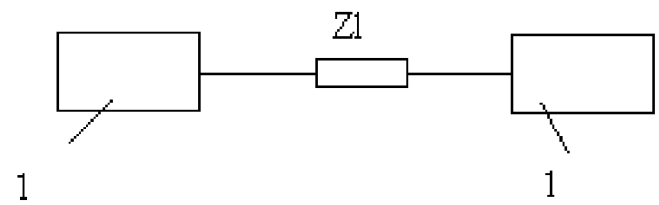
FIG. 9 depicts an implementation of a bridge amplifier according to the invention.

FIG. 9 shows an implementation where two three-level switching stages 1 can be used in bridge configuration. In this example, two three level switching stages 1 are coupled to series via a line have impedance Zl. This implementation allows generating a 5-level differential voltage across the load.

Figure 10:
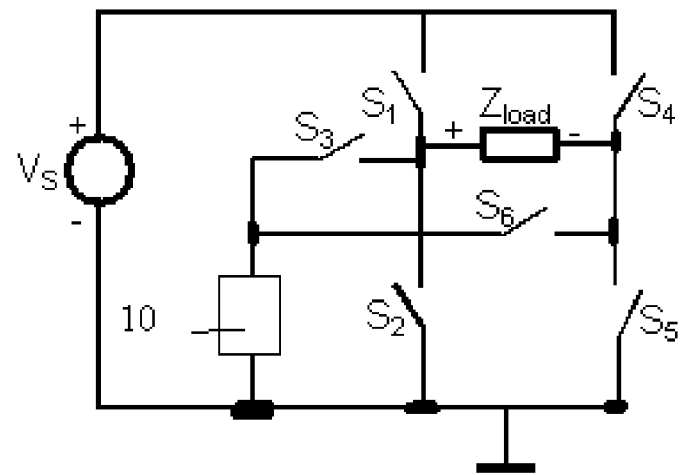
FIG. 10 depicts an alternative implementation of a bridge amplifier.

FIG. 10 depicts an alternative implementation of a bridge amplifier. In this example, the capacitive divider 10, shown in FIG. 6 is coupled to a switches Sl-S5 and a load (Load$_z$), In the implementation shown in FIG. 5, the current in $C_1$ can be set positive or negative such that the voltage on $C_1$ is kept within a specified range. In order to control the capacitor voltage, a controller that decides between charge and discharge, is provided. For an arbitrary load, e.g. a loudspeaker, the phase relation between voltage and current of the load is not known. Therefore the voltage on the capacitor must be measured resulting in a decision: charge or discharge at the next occasion when the capacitor is connected to the load. This decision can be maintained during the whole PWM pulse but it is also possible to toggle between charge and discharge within the PWM pulse. In the latter case the value of the capacitor may be lower at the price of more dynamic switching losses and more EMI. The capacitor together with the switching frequency represent an impedance that, depending on the switching frequency and the capacitor value, is dominated by 1/fC or the series resistance of the switches. In order to keep the distortion low the total impedance in series with the load should have low dependence on the setting of the switches. If the capacitor is big enough to be a low impedance for the lowest audio frequencies (like the loudspeaker coupling capacitor in a linear amplifier) it is not necessary to have a charge/discharge controller. The charging and discharging can than simply be in phase with the audio current through the load.

The amount of power that can be delivered to the loudspeaker load depends on the available supply voltage and the loudspeaker load impedance. The maximum sinewave power that can be delivered to the load is proportional to the square of the maximum amplitude output signal.

Figure 11:
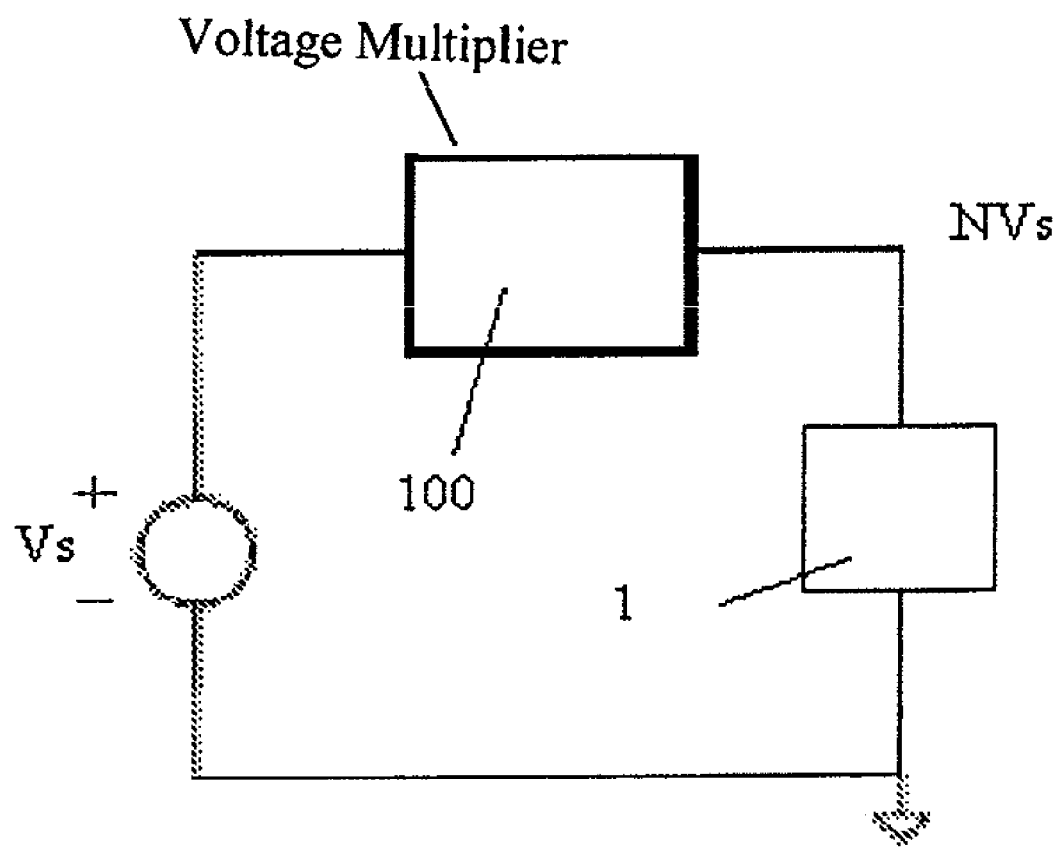
FIG. 11 depicts a chip comprising a power amplifier according to the invention.

To increase the amount of power that can be delivered to the load, the supply voltage may be increased or the load impedance lowered or a combination of both options can be used. The loudspeaker load impedance cannot be made infinitely small and the available supply voltage is often fixed. This especially holds for portable devices where the supply is a battery with a given cell voltage. To increase the amount of power that can be delivered to the load the supply voltage may be boosted. The switching power-stage of a class-D amplifier is then operated from the boosted power supply with a higher voltage as shown in FIG. 11.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. An amplifier comprising:
   a switchable capacitive divider for dividing a supply voltage delivered to the amplifier, the switchable capacitive divider including
   a first switch coupled to a second switch via a second capacitor,
   the first switch being further coupled to a first terminal of a third switch,
   the second switch being further coupled to a first terminal of a fourth switch,
   a second terminal of the third switch being coupled to a second terminal of the fourth switch, the second terminal of the third switch also coupled to an output node;
   a coupling circuit, coupled to the switchable capacitive divider by a first wire, for determining a connection path between said first wire, a first capacitor and a first switchable power circuit,
   the first capacitor being coupled to the output node, said output node being further coupled to the first switchable power circuit via a fifth switch having a first terminal coupled to the output node and a second terminal coupled to a first power terminal.

2. An amplifier comprising:
   a switchable capacitive divider for dividing a supply voltage delivered to the amplifier, the switchable capacitive divider including
   a first switch coupled to a second switch via a second capacitor,
   the first switch being further coupled to a first terminal of a third switch,
   the second switch being further coupled to a first terminal of a fourth switch,
   a second terminal of the third switch being coupled to a second terminal of the fourth switch, the second terminal of the third switch also coupled to an output node, the output node being coupled to a first power terminal and a fifth switch being coupled between the first capacitor and the output node; and
   a coupling circuit, coupled to the switchable capacitive divider by a first wire, for determining a connection path between said first wire, a first capacitor and a first switchable power circuit.

3. The amplifier according to claim 2, wherein the first switchable power circuit comprises a sixth switch and a seventh switch, a first terminal of the sixth switch being coupled to a first terminal of the seventh switch, the sixth switch also coupled to the first power terminal.

4. The amplifier according to claim 3, wherein the amplifier is a bridge amplifier having the first power terminal coupled to an output load.

5. The amplifier according to claim 4, further comprising a second switchable power circuit, the amplifier coupled to a first terminal of a load, the second switchable power circuit having its output power terminal coupled to a second terminal of the load, and an eighth switch for coupling an output of the switchable capacitive divider to a second power terminal.

6. An amplifier comprising:
   a switchable capacitive divider for dividing a supply voltage delivered to the amplifier,
   a coupling circuit, coupled to the switchable capacitive divider by a first wire, for determining a connection path between said first wire, a first capacitor and a first switchable power circuit, wherein the amplifier is internal to an integrated circuit, the integrated circuit including a voltage multiplier coupled to the supply voltage that supplies the amplifier with a variable voltage.

7. An amplifier comprising:
   a switchable capacitive divider configured to divide a supply voltage delivered to the amplifier, the switchable capacitive divider including:
   a first switch, a first capacitor, and a second switch coupled in series, the capacitor separating the first and second switches, a connection between a first end of the capacitor and the first switch forming a first reference node, and a connection between a second end of the capacitor and the second switch forming a second reference node;
   a third switch having a first end coupled to the first reference node and a second end coupled to an output of the switchable capacitive divider circuit; and
   a fourth switch having a first end coupled to the second reference node and a second end coupled to the output of the capacitive divider circuit; and
   a coupling circuit for determining a connection path between the output of the switchable capacitive divider, a second capacitor, and a first switchable power circuit, the coupling circuit including one or more switches and having a first terminal coupled to the output of the switchable capacitive divider circuit, a second terminal coupled to a second capacitor, and a third terminal coupled to a switchable power circuit.

8. The amplifier of claim 7, wherein the coupling circuit includes:
   a fifth switch having a first end coupled to the output of the switchable capacitive divider circuit and a second end coupled to the switchable power circuit; and
   a sixth switch having a first end coupled to the output of the switchable capacitive divider circuit and a second end coupled to an additional switchable power circuit.

* * * * *